United States Patent
Kimura (10) Patent No.: US 7,958,481 B2
(45) Date of Patent: Jun. 7, 2011

(54) METHOD OF DESIGNING A SEMICONDUCTOR INTEGRATED CIRCUIT HAVING A DUMMY AREA AND THE SEMICONDUCTOR INTEGRATED CIRCUIT THEREOF

(75) Inventor: Yoshitaka Kimura, Chiba (JP)

(73) Assignee: Kawasaki Microelectronics, Inc., Chiba (JP)

( * ) Notice: Subject to any disclaimer, the term of this patent is extended or adjusted under 35 U.S.C. 154(b) by 352 days.

(21) Appl. No.: 12/230,309

(22) Filed: Aug. 27, 2008

(65) Prior Publication Data

US 2009/0064078 A1 Mar. 5, 2009

(30) Foreign Application Priority Data

Aug. 28, 2007 (JP) ................................. 2007-220548

(51) Int. Cl.
*G06F 17/50* (2006.01)

(52) U.S. Cl. ........ 716/119; 716/100; 716/110; 716/118; 716/122

(58) Field of Classification Search ................ 716/8–11, 716/19, 21, 50, 100, 110, 118, 119, 122
See application file for complete search history.

(56) References Cited

U.S. PATENT DOCUMENTS

| 6,563,148 | B2 | 5/2003 | Kawashima et al. | |
|---|---|---|---|---|
| 7,679,202 | B2* | 3/2010 | Yoshida et al. | 257/797 |
| 2001/0048145 | A1* | 12/2001 | Takeuchi et al. | 257/620 |
| 2005/0009298 | A1* | 1/2005 | Suzuki et al. | 438/459 |
| 2007/0296091 | A1 | 12/2007 | Yoshida et al. | |

FOREIGN PATENT DOCUMENTS

| JP | A-2002-009161 | 1/2002 |
|---|---|---|
| JP | A-2004-311587 | 11/2004 |
| JP | A-2008-004724 | 1/2008 |

* cited by examiner

*Primary Examiner* — Sun J Lin
(74) *Attorney, Agent, or Firm* — Oliff & Berridge, PLC

(57) ABSTRACT

An exemplary semiconductor integrated circuit is formed on a surface of a semiconductor chip includes a circuit region and a dummy region on the surface of the semiconductor chip. The circuit region includes a plurality of circuit patterns, which form circuit elements of the semiconductor integrated circuit, in a plurality of pattern layers. The dummy region includes a plurality of character dummies, which do not contribute to an operation of the semiconductor integrated circuit. The character dummies have a fixed shape and dimension, and arranged in a character pattern layer selected from the plurality of pattern layers with a fixed pitch. The dummy region further includes an identification sign formed by connecting selected ones of the character dummies chosen from the plurality of the character dummies.

15 Claims, 6 Drawing Sheets

METHOD OF DESIGNING A SEMICONDUCTOR INTEGRATED CIRCUIT HAVING A DUMMY AREA AND THE SEMICONDUCTOR INTEGRATED CIRCUIT THEREOF

Exemplary embodiments of the present invention were first described in and claim priority from Japanese Application No. 2007-A-220548, which is incorporated herein by reference in its entirety.

BACKGROUND

The present invention relates to semiconductor integrated circuits having identification signs, and also relates to methods of designing semiconductor integrated circuits having identification signs. More specifically, this invention relates to semiconductor integrated circuits and methods of designing semiconductor integrated circuits having identification signs that are highly visible even if dummy patterns are arranged around the identification signs.

In an aluminum wiring process of manufacturing semiconductor devices, $SiO_2$ interlayer dielectric layers are polished by chemical-mechanical polishing (CMP). In a Cu wiring process, on the other hand, Cu wiring layers are polished by CMP. When the CMP is not performed uniformly, it is difficult to control the diameters of vias or widths of wirings in the lithography processes that come after the CMP processes.

In order to solve the above-mentioned problem, the method of arranging dummy patterns (dummies), near the circuit pattern is used. Japanese patent laid open gazette No. 2002-9161 (Reference 1), which is incorporated herein by reference in its entirety discloses an exemplary method of arranging dummy patterns, in which i) dummies are arranged with a predetermined pitch, and ii) the dummies that crossover on circuit patterns are deleted.

Character patterns are formed in the semiconductor device as identifying signs, which are comprised of figures, alphabets, etc. The character patterns show, for example, name, kind, type, version of the device, version of a mask of the device, the logo of the company which fabricates the device, the marks for showing the test result of the device, etc. The character patterns are commonly called "logos," and usually are formed with a metal layer at the corner or other portions of the semiconductor chip.

It is possible to insert the dummy pattern into the area where the character patterns are formed by a conventional method such as disclosed in Reference 1. However, insertion of the dummy pattern by the conventional method makes it extremely difficult to observe the character pattern.

Figure 3:
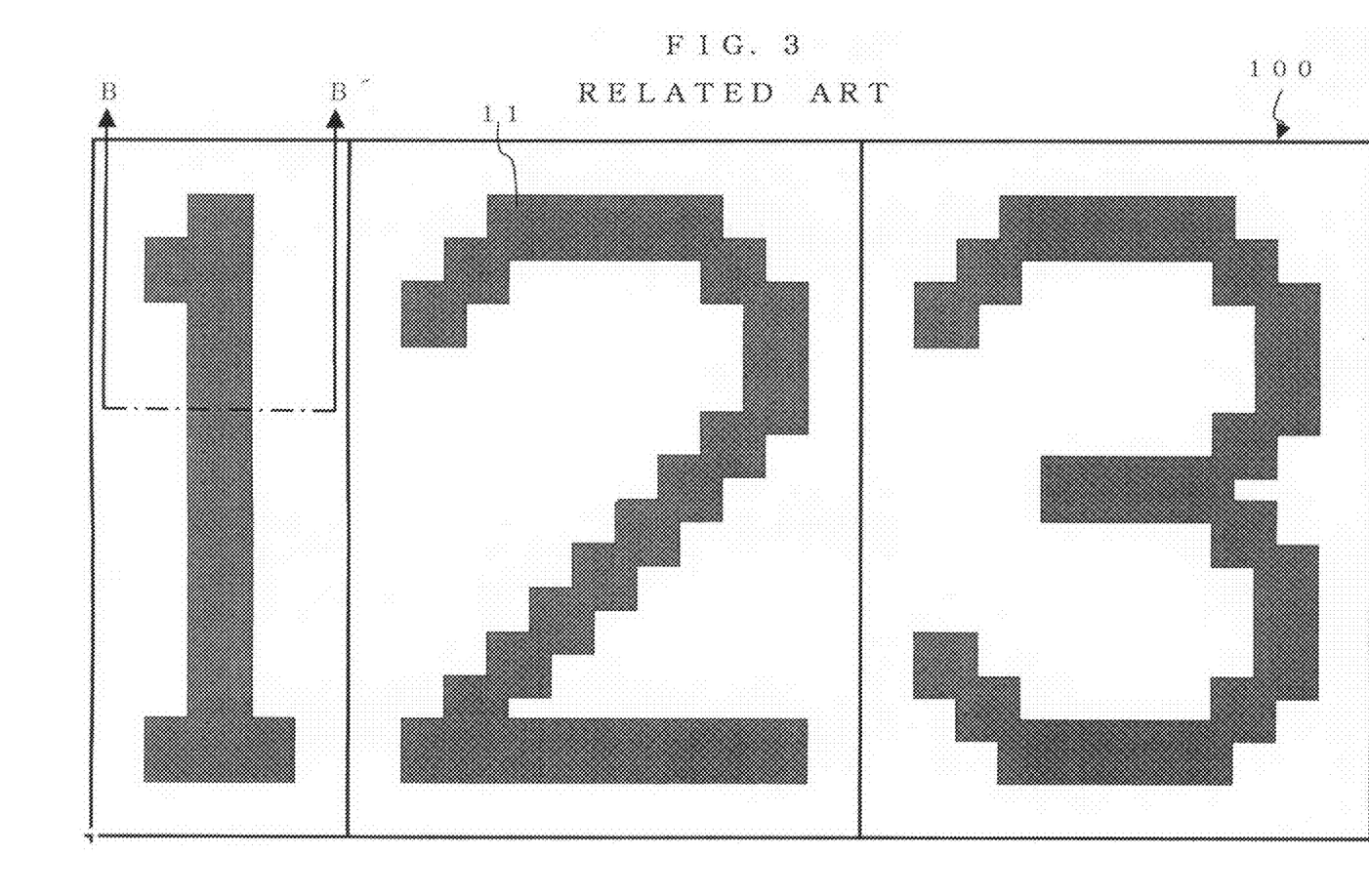
FIG. 3 shows an exemplary plane view of an identification sign of a related art.
Figure 4A:
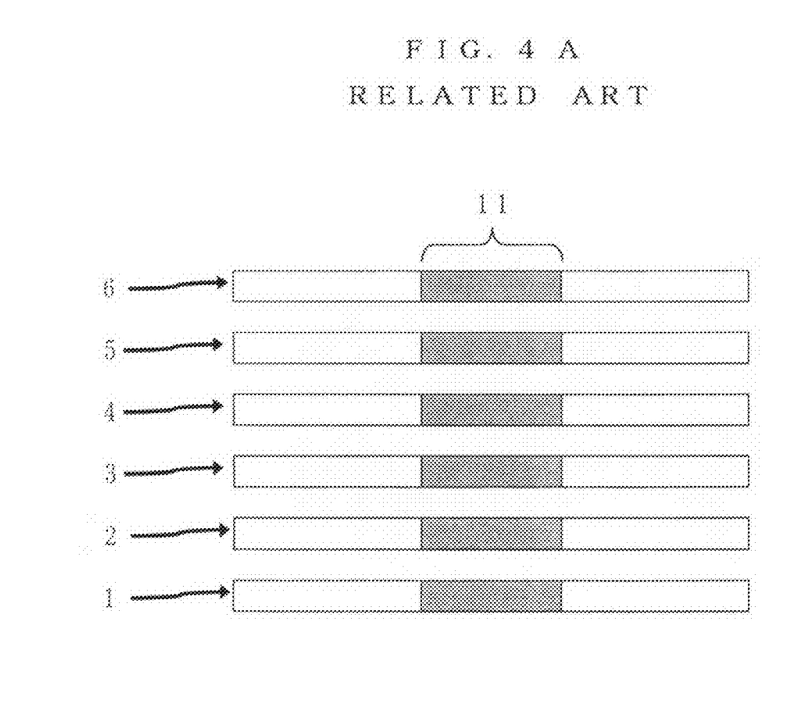
FIG. 4A shows a cross-sectional view along the line B-B' of FIG. 3 before dummy patterns are inserted into an identification sign by the method described in Reference 1 as related art.
Figure 4B:
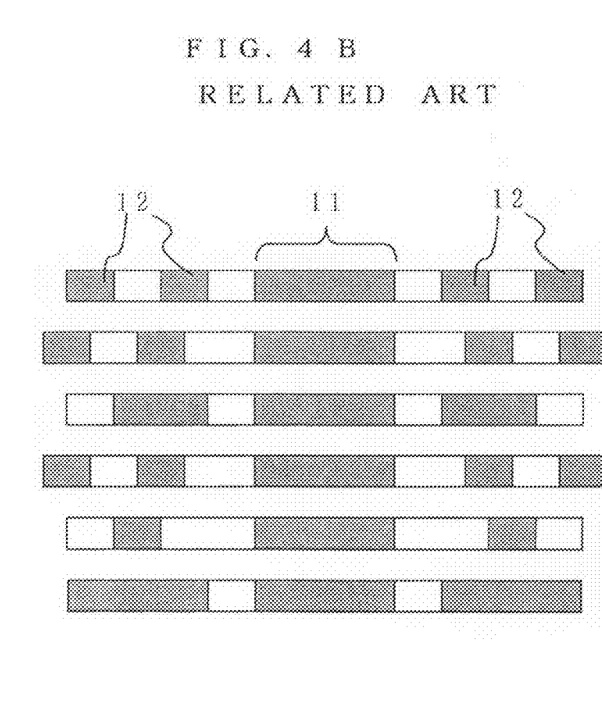
FIG. 4B shows a cross-sectional view along the line B-B' of FIG. 3 after dummy patterns are inserted into an identification sign by the method described in Reference 1 as related art.

FIG. 3 is an exemplary plane view of a conventional character pattern. FIGS. 4A and 4B show cross-sectional views along the line B-B' of FIG. 3 before and after the insertion of dummy patterns 12, respectively, around the character pattern 11 by the method disclosed in Reference 1. The dummy patterns 12 inserted into different layers are shifted horizontally with each other.

Figure 5A:
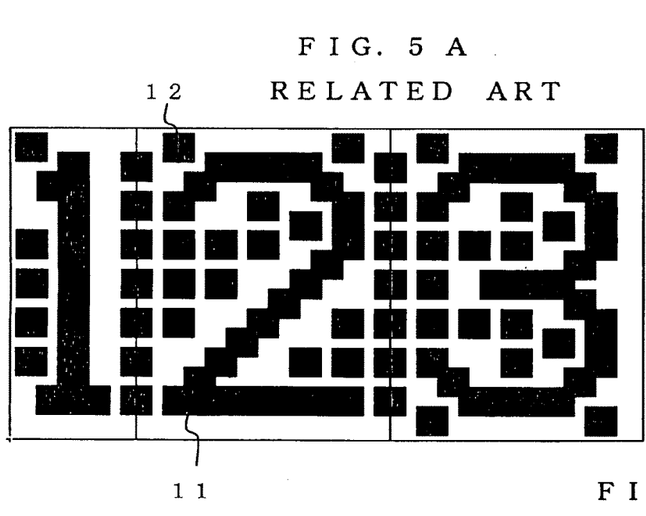
FIG. 5A shows an exemplary plane view of an identification sign in a first metal layer after dummies are inserted into the identification signs formed by a method of related art.
Figure 5B:
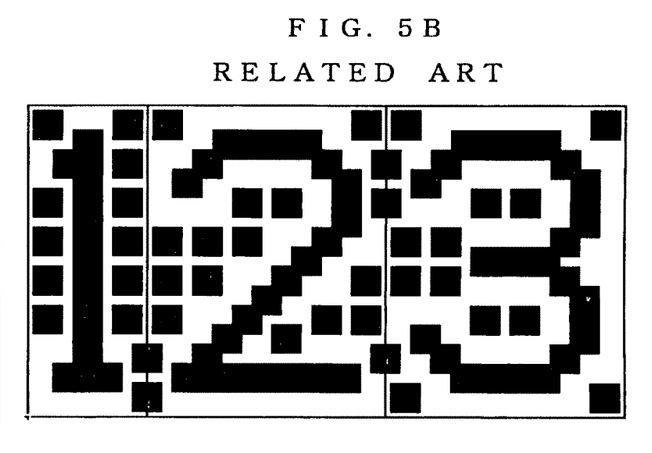
FIG. 5B shows an exemplary plane view of an identification sign in a second metal layer after dummies are inserted into the identification sign formed by a method of related art.
Figure 5C:
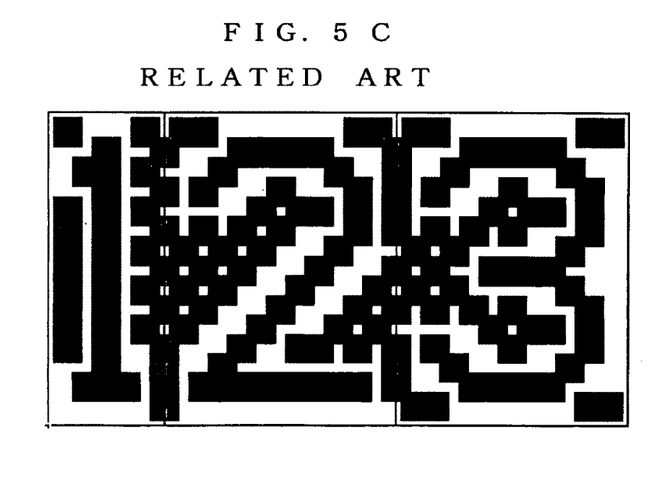
FIG. 5C shows an exemplary plane view of the second metal layer of FIG. 5B being stacked over the first metal layer of FIG. 5A.

More details are explained with reference to FIGS. 5A, 5B, and 5C. FIG. 5A is a plane view of an exemplary character pattern in the first metal layer after insertion of dummy patterns using the conventional method described above. FIG. 5B is a plane view of an exemplary character pattern in the second metal layer after insertion of dummy patterns using the conventional method. FIG. 5C is a plane view of the pattern in the second metal layer shown in FIG. 5B stacked over the pattern in the first metal layer shown in FIG. 5A.

Conventionally, after circuit element patterns, which are not shown in FIG. 5, and character patterns are arranged, dummy patterns are inserted as follows. First, dummies having a predetermined shape, such as a rectangular shape shown in FIG. 5, and a predetermined size are arranged with a predetermined pitch in the entire area where the circuit element patterns and the character patterns are arranged. Then, dummies that crossover on the circuit patterns or the character patterns are deleted.

The shape, the size of the dummies, the pitch, and the starting point of the arrangement are decided so as to minimize the amount of Computer Aided Design (CAD) processing within a range that provides necessary pattern density. Therefore, the space between the character patterns and the dummies are not uniform as shown in FIG. 5A or 5B. Accordingly, the visibility of character patterns is decreased by inserting the dummy pattern. Furthermore, because the shape, the size, the arrangement, etc. of the circuit element pattern are different in each layer, the shape, the size, the arrangement pitch, and the starting point of the dummy pattern arrangements are also different in each layer. Therefore, the dummy patterns inserted in two or more layers partially overlap as shown in FIG. 5C, and the visibility of the character pattern decreases remarkably.

SUMMARY

An exemplary aspect of the present invention is a semiconductor integrated circuit that has excellent visibility of an identification sign, even though dummy patterns are inserted around the identification sign, and a method of designing a semiconductor integrated circuit pattern included in the semiconductor integrated circuit.

According to one exemplary aspect of the present invention, a semiconductor integrated circuit is formed on a surface of a semiconductor chip, comprising: a circuit region on the surface of the semiconductor chip, the circuit region comprising a plurality of circuit patterns, which form circuit elements of the semiconductor integrated circuit, in a plurality of pattern layers; and a dummy region on the surface of the semiconductor chip, the dummy region comprising a plurality of character dummies, which do not contribute to an operation of the semiconductor integrated circuit, having a fixed shape and a fixed dimension in a character pattern layer selected from the plurality of pattern layers, the character dummies being arranged with a fixed pitch, wherein the dummy region further comprises an identification sign formed by connecting selected character dummies chosen from the plurality of character dummies.

According to another exemplary aspect of the present invention, a method of designing a semiconductor integrated circuit comprising: arranging a plurality of circuit patterns, which form circuit elements of the semiconductor integrated circuit, in a plurality of pattern layers within a circuit region of the semiconductor integrated circuit; and inserting circuit dummies around the circuit patterns, wherein the method further comprises: preparing instances of a plurality of unit identification areas having a same unit dimension; each of the unit identification areas including a plurality of character dummies, which do not contribute to an operation of the semiconductor integrated circuit, in a character pattern layer selected from the plurality of pattern layers; the character dummies having a fixed shape and a fixed dimension and being arranged in an entirety of each of the unit identification areas with a fixed pitch; the plurality of unit identification areas further including respective character patterns formed by connecting respective character dummies; and arranging selected unit identification areas from the plurality of unit identification areas using the instances within a dummy region of the semiconductor integrated circuit.

DETAILED DESCRIPTION OF EMBODIMENTS

Figure 6:
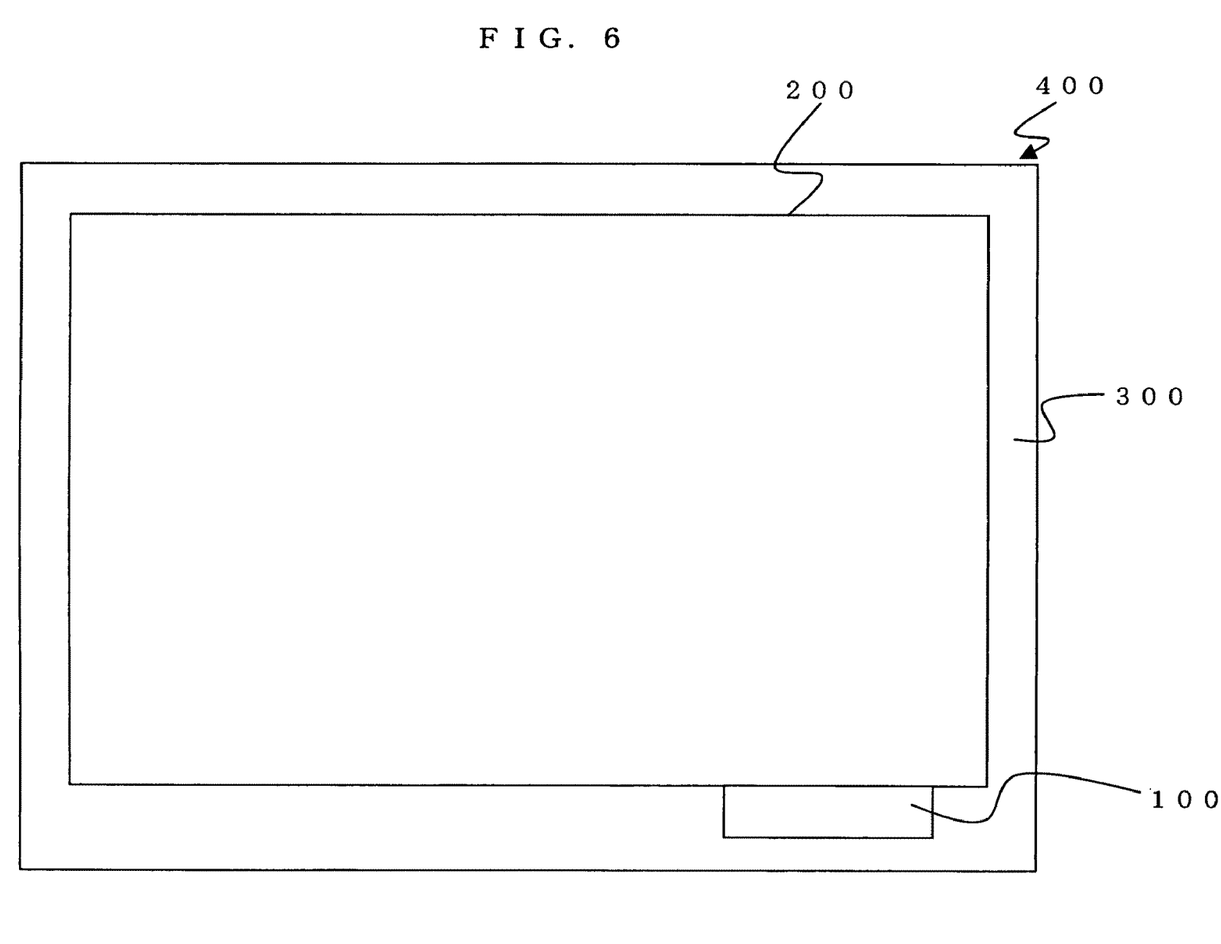
FIG. 6 shows an exemplary plane view of a semiconductor chip including a circuit region and a dummy region, which includes an identification sign, of related art.

FIG. 6 is a plane view showing an exemplary semiconductor chip 400. The semiconductor chip 400 includes a circuit region 200 and a dummy region 300. In the circuit region 200, circuit element patterns are formed, which contribute to the operation of the semiconductor chip. In the dummy region 300, an identification sign, test elements, and other elements are formed, which do not contribute to the operation of the semiconductor chip.

Figure 1:
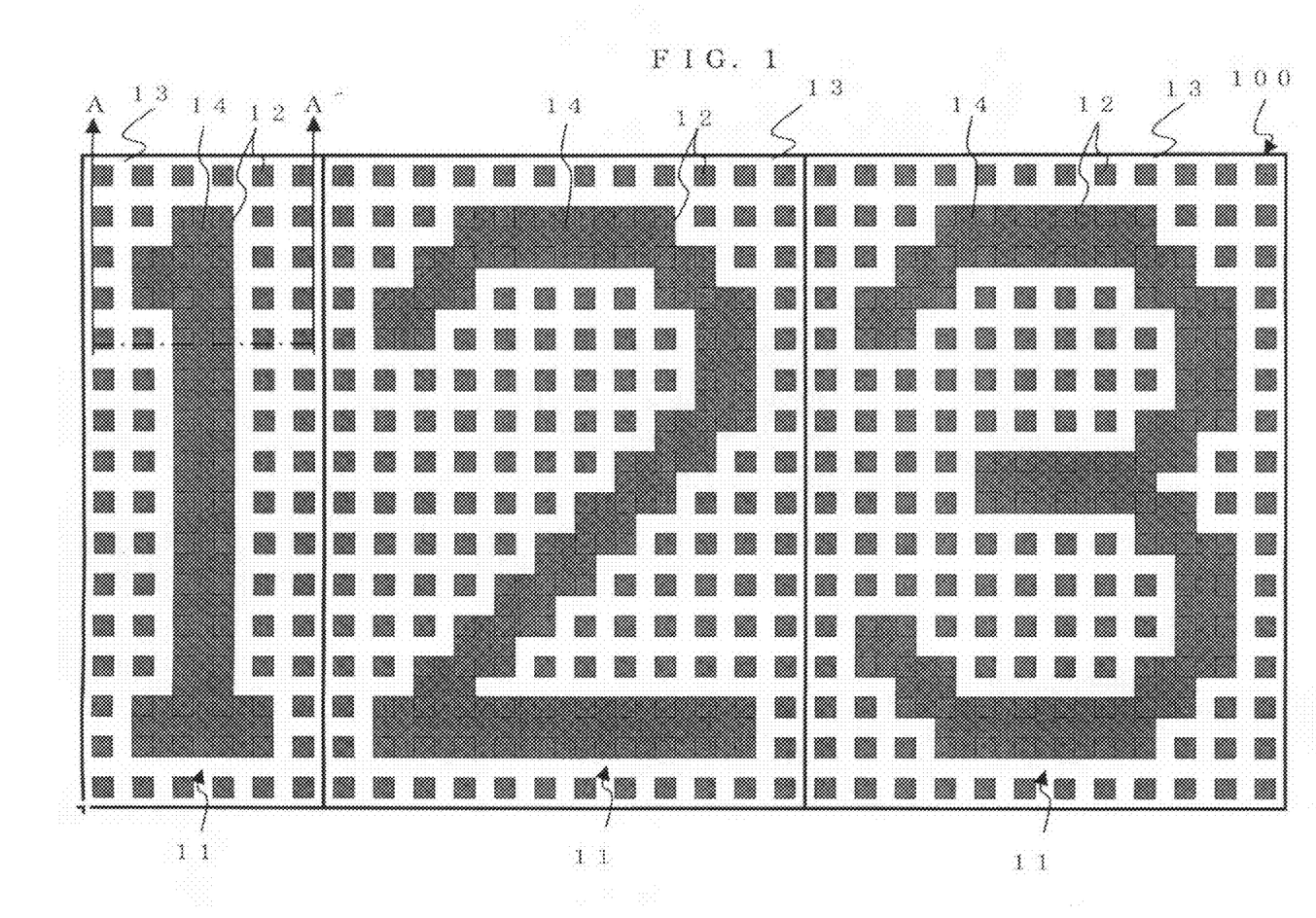
FIG. 1 shows an exemplary plane view of an identification sign of the present invention.
Figure 2:
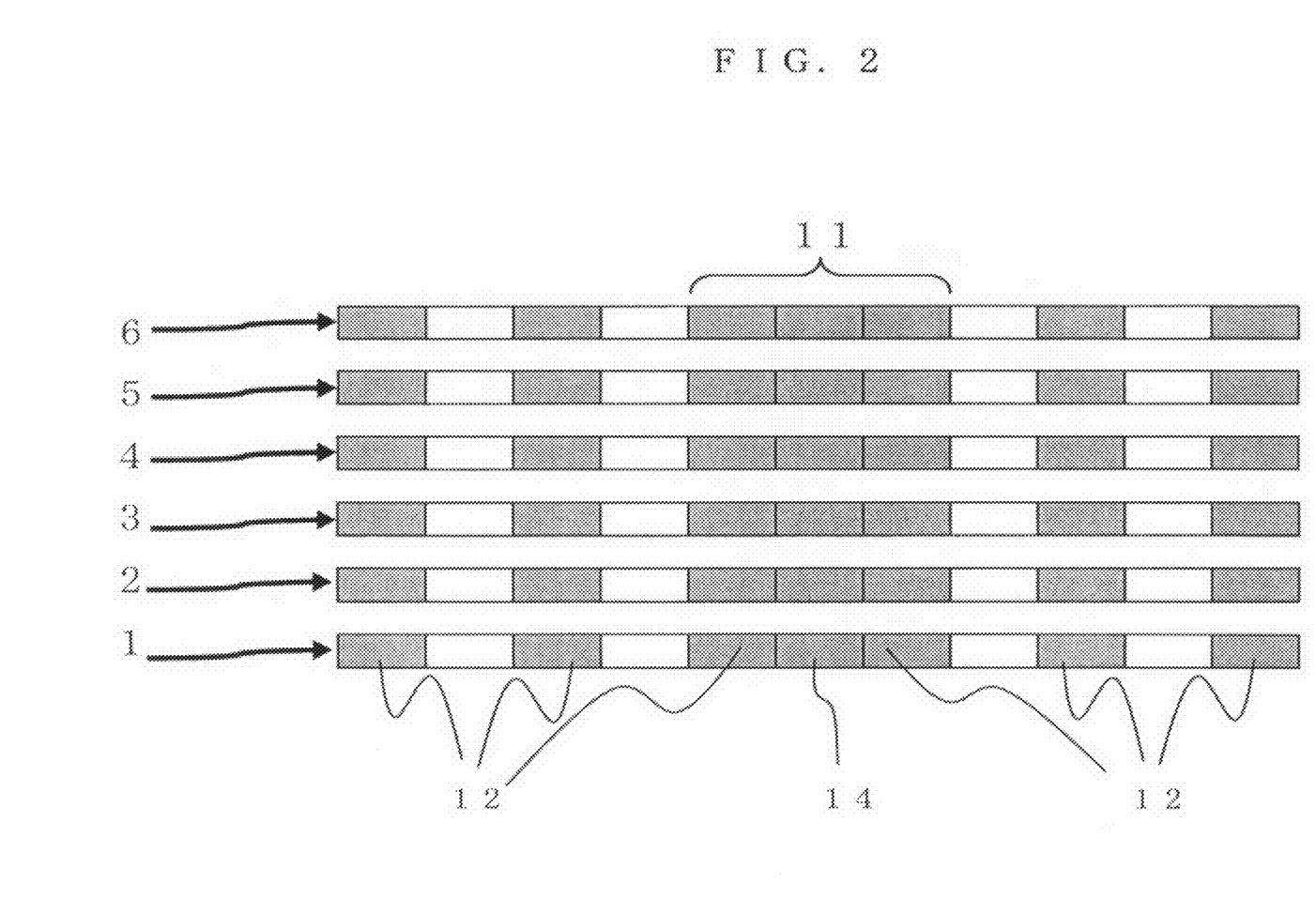
FIG. 2 shows an exemplary cross-sectional view along the line A-A' of FIG. 1.

FIG. 1 is a plane view showing an exemplary identification sign 100 formed in a dummy region 300 on a semiconductor chip 400, as shown in FIG. 6, according to the present invention. As shown in FIG. 1, selected ones of dummies 12 in a layer are connected with connection parts 14 in the same layer, and thus an exemplary identification sign 100 is formed in the dummy region 300.

The exemplary identification sign 100 shown in FIG. 1 is formed with three unit identification areas 13 having respective patterns representing characters (character patterns). Specifically, unit identification areas 13 having character patterns 11 representing Arabic numerals "1", "2", and "3" are shown in FIG. 1. Various different identification signs with character patterns representing various different characters may be formed. Dummies with a fixed shape and a fixed size are arranged with a fixed pitch in an entire area of each of the unit identification areas. Connecting selected ones of dummies 12 with connecting parts 14 in the same layer forms character patterns 11.

In each of the unit identification areas 13, connecting selected ones of dummies 12 forms a character pattern 11. Because the distance between the character pattern 11 and the dummies 12, which are not connected to form the character pattern 11, is nearly constant, the visibility of the identification sign according to the present invention is high. On the other hand, the visibility of the identification sign severely degrades if the dummies are inserted by the conventional method, because the distances between the character pattern and the dummy patterns are un-uniform. The shape, the size, and the distance between the character dummies 12 used for forming the character patterns 11 are independently determined from the dummies inserted around the circuit patterns. Therefore, when arranging the character dummies 12 in a plurality of layers, it is possible to arrange the character dummies 12 in different layers at the same positions. Accordingly, the identification sign 100 remains highly visible even when the identification signs in different layers are stacked.

As exemplary unit identification areas, FIG. 1 shows three unit identification areas 13 with characters "1," "2," and "3", respectively. The unit identification areas 13 with characters "2" and "3" have the same dimensions. Specifically, both are rectangular areas with same dimensions in both the vertical and the horizontal directions. The unit identifying area 13 with character "1" is also a rectangular area having the same dimension in the vertical direction. However, the dimension of the unit identifying area 13 with character "1" in the horizontal direction is half that of the unit identifying areas 13 with the characters "2" and "3".

When the character dummies 12 are arranged in two or more layers, it is preferable that the character dummies 12 in the two or more layers are arranged in the same positions. As a result, exemplary semiconductor integrated circuits having identification signs 100 with high visibility may be realized.

An exemplary manufacturing process of the semiconductor device of the present invention is explained below:

It is preferable that the density of the wiring pattern of the semiconductor device in the manufacturing area is as uniform as possible in order to obtain uniform polishing in the CMP process. An exemplary method of manufacturing semiconductor devices is explained, in which the density of wiring pattern is restricted within the range from 20 to 80%.

(1) Rectangular figures of the same size are arranged with an equal interval in the area where an identification sign is formed. For instance, square figures with an edge length of 1 μm are arranged with an equal interval of 1 μm. FIG. 1 shows an exemplary unit identifying area in which 12 pieces of the square figures are arranged in the horizontal direction and 16 pieces of the square figures are arranged in the vertical direction. The pattern density, which is calculated as the value of area of the square figures divided by the area of the unit identifying area, is 25%, and hereby satisfies the lower-limit (20%) of the restriction of the design.

(2) The arrangement of the figures, such as rectangular figures, with an equal interval ensures the visibility of the identification sign. The figures may be arranged at every grid point. However, the figures may also be arranged, for example, only at alternate grid points such that the interval between the figures is equal in order to ensure visibility.

(3) The rectangular figures are arranged in all of the wiring layers at same positions in the wiring layers, such that the rectangular figures in different layers completely overlap when they are observed from above.

(4) Then, the rectangular figures are connected with each other by wiring, and a character pattern 11 is formed in each of the unit identification areas. The character pattern may be formed only in the top layer, or the same character pattern may also be formed in the lower wiring layers below the top layer. The pattern density after formation of the character pattern does not usually exceed 50%, and satisfies the upper-limit (80%) due to the restriction of the design.

An exemplary method of designing patterns of semiconductor integrated circuits according to the present invention is explained below:

Step (a): A plurality of unit identification areas for forming identification signs are prepared in order to use the unit identification areas as components for use in the design. The components are also called instances. That is, dummies having a fixed shape and a fixed dimension are arranged within an entire area of each of the unit identification areas with a fixed pitch. Selected ones of the dummies are mutually connected by connecting the parts in the same layer such that respective character patterns are formed in the plurality of unit identification areas. Then, instances of the unit identification areas, which include layout data of the unit identification areas, are registered as components in the library of a CAD system for designing semiconductor integrated circuit patterns. The components can be commonly utilized in the design of a plurality of semiconductor integrated circuits by using the CAD system.

Step (b): Selected unit identification areas, which were prepared as components by the above step (a), are arranged in the dummy region of the semiconductor integrated circuit where no circuit element is formed. Specifically, selected unit identification areas having patterns of required characters are arranged in an appropriate order to form an identification sign. The arrangement of the unit identification areas is performed using the instances registered in the library of the CAD system.

Step (c): Patterns of the circuit elements of the semiconductor integrated circuit are arranged in the circuit region of the semiconductor integrated circuit. This step may be performed either before or after Step (b).

Step (d): The unit identification areas thus arranged are covered by a dummy protecting layer in order to prevent inserting circuit dummies in the unit identification areas.

Step (e): Circuit dummies are inserted around the circuit patterns, which were arranged by Step (c), by an exemplary method described in Reference 1. No dummy is inserted into the unit identification areas, because it is covered by the dummy protecting layer.

When the identification sign formed by the method of the present invention is observed from the top of the semiconductor chip, the identification sign can be observed clearly even though each character pattern is surrounded by dummies. That is, the exemplary identification sign according to the present invention has superior visibility compared with the visibility of the conventional identification sign. Moreover, because the pattern densities within the unit identification areas are maintained within the restricted range, normal operation of circuit elements arranged near the identification sign are ensured.

The exemplary semiconductor integrated circuit, the exemplary method of manufacturing a semiconductor integrated circuit, and the exemplary method of designing a semiconductor integrated circuit discussed above have been described in detail with reference to exemplary embodiments. However, the present invention is not limited to the details of these exemplary embodiments, but various improvements and modifications are possible without departing from the spirit and the scope of the invention.

What is claimed is:

1. A semiconductor integrated circuit formed on a surface of a semiconductor chip, comprising:
   a circuit region on the surface of the semiconductor chip, the circuit region comprising a plurality of circuit patterns, which form circuit elements of the semiconductor integrated circuit, in a plurality of pattern layers; and
   a dummy region on the surface of the semiconductor chip, the dummy region comprising a plurality of character dummies, which do not contribute to an operation of the semiconductor integrated circuit, having a fixed shape and a fixed dimension in at least one character pattern layer selected from the plurality of pattern layers, the plurality of character dummies being arranged with a fixed pitch,
   wherein the dummy region further comprises an identification sign formed by connecting selected character dummies chosen from the plurality of character dummies.

2. The semiconductor integrated circuit according to claim 1, wherein:
   the at least one character pattern layer includes two or more character pattern layers selected from the plurality of pattern layers; and
   the character dummies in the two or more character pattern layers are arranged at the same positions.

3. The semiconductor integrated circuit according to claim 1, wherein:
   the dummy region comprises a plurality of unit identification areas having a same unit dimension;
   the character dummies are arranged within an entirety of each of the plurality of unit identification areas with the fixed pitch; and
   the plurality of unit identification areas include respective character patterns formed by connecting respective character dummies so that the character patterns in the plurality of unit identification areas form the identification sign.

4. The semiconductor integrated circuit according to claim 3, wherein the circuit region comprises a plurality of circuit dummies at least in the at least one character pattern layer, the plurality of circuit dummies are arranged around the circuit patterns with a second pitch different from the fixed pitch of the character dummies.

5. The semiconductor integrated circuit according to claim 3, wherein:
   each of the plurality of unit identification areas has a rectangular shape having an edge; and
   the character dummies are arranged in each of the plurality of unit identification areas in a first direction parallel to the edge and in a second direction perpendicular to the first direction.

6. A method of designing a layout of a semiconductor integrated circuit by using a CAD system comprising:
   arranging a plurality of circuit patterns, which form circuit elements of the semiconductor integrated circuit, in a plurality of pattern layers within a circuit region of the semiconductor integrated circuit;
   inserting circuit dummies around the circuit patterns;
   registering instances of a plurality of unit identification areas having a same unit dimension in a library of the CAD system;
   each of the plurality of unit identification areas including a plurality of character dummies, which do not contribute to an operation of the semiconductor integrated circuit, in at least one character pattern layer selected from the plurality of pattern layers;
   the plurality of character dummies having a fixed shape and a fixed dimension and being arranged in an entirety of each of the plurality of unit identification areas with a fixed pitch;
   the plurality of unit identification areas further including respective character patterns formed by connecting respective character dummies; and arranging unit identification areas selected from the plurality of unit identification areas using the instances registered in the library of the CAD system within a dummy region of the semiconductor integrated circuit.

7. The method according to claim 6, wherein:
the at least one character pattern layer includes two or more character pattern layers selected from the plurality of pattern layers; and
the character dummies in the two or more character pattern layers are arranged at same positions.

8. The method according to claim 6, wherein:
each of the plurality of unit identification areas has a rectangular shape having an edge; and
the character dummies are arranged in each of character cells in a first direction parallel to the edge and in a second direction perpendicular to the first direction.

9. The method according to claim 6, wherein the inserting step comprises (1) covering the unit identification areas arranged within the dummy region with a protecting layer, and (2) inserting the circuit dummies while preventing insertion of the circuit dummies within the unit identification areas by using the protecting layer.

10. A semiconductor integrated circuit formed on a surface of a semiconductor chip, comprising:
a plurality of unit identification areas having a same unit dimension arranged on the surface of the semiconductor chip, wherein:
each of the plurality of unit identification areas includes a plurality of character dummies, which do not contribute to an operation of the semiconductor integrated circuit, in at least one character pattern layer;
the plurality of character dummies having a fixed shape and a fixed dimension and being arranged in an entirety of the each of the plurality of unit identification areas with a fixed pitch; and
the plurality of unit identification areas comprise respective character patterns formed by connecting respective character dummies.

11. The semiconductor integrated circuit according to claim 10, wherein:
the at least one character pattern layer includes two or more character pattern layers; and
the character dummies in the two or more character pattern layers are arranged at the same positions.

12. The semiconductor integrated circuit according to claim 10, wherein:
each of the plurality of unit identification areas has an rectangular shape having an edge; and
the character dummies are arranged in each of character cells in a first direction parallel to the edge and in a second direction perpendicular to the first direction.

13. A library embedded in a CAD system, when executed, causing the CAD system to design semiconductor integrated circuits, the library comprising:
instances of a plurality of unit identification areas,
wherein:
each of the plurality of unit identification areas has a same unit dimension;
each of the plurality of unit identification areas include character dummies, which do not contribute to operations of the semiconductor integrated circuits, in at least one character pattern layer;
the character dummies have a fixed shape and a fixed dimension and are arranged within an entirety of the each of the plurality of unit identification areas with a fixed pitch; and
the plurality of unit identification areas include respective character patterns formed by connecting respective character dummies.

14. The library according to claim 13, wherein:
the at least one character pattern layer includes two or more character pattern layers; and
the character dummies in the two or more character pattern layers are arranged at the same positions.

15. The library according to claim 13, wherein:
each of the plurality of unit identification areas has an rectangular shape having an edge; and
the character dummies are arranged in each of the plurality of unit identification areas in a first direction parallel to the edge and in a second direction perpendicular to the first direction.

* * * * *